United States Patent
Al-Dabagh et al.

(10) Patent No.: US 6,907,586 B1
(45) Date of Patent: Jun. 14, 2005

(54) INTEGRATED DESIGN SYSTEM AND METHOD FOR REDUCING AND AVOIDING CROSSTALK

(75) Inventors: Maad A. Al-Dabagh, Sunnyvale, CA (US); Alexander Tetelbaum, Hayward, CA (US); Tammy T. Huang, Fremont, CA (US)

(73) Assignee: LSI Logic Corporation, Milpitas, CA (US)

(*) Notice: Subject to any disclaimer, the term of this patent is extended or adjusted under 35 U.S.C. 154(b) by 426 days.

(21) Appl. No.: 09/968,009

(22) Filed: Oct. 2, 2001

(51) Int. Cl.⁷ .............................................. G06F 17/50
(52) U.S. Cl. ................................. 716/5; 716/6; 703/14
(58) Field of Search ............................. 716/5, 6, 4, 10, 716/13, 19; 703/14

(56) References Cited

U.S. PATENT DOCUMENTS

| | | | |
|---|---|---|---|
| 5,535,133 A * | 7/1996 | Petschauer et al. | 716/19 |
| 5,555,506 A * | 9/1996 | Petschauer et al. | 703/13 |
| 5,596,506 A * | 1/1997 | Petschauer et al. | 716/5 |
| 6,018,623 A * | 1/2000 | Chang et al. | 716/6 |
| 6,128,769 A * | 10/2000 | Carlson et al. | 716/6 |
| 6,405,350 B1 * | 6/2002 | Tawada | 716/5 |
| 6,493,853 B1 * | 12/2002 | Savithri et al. | 716/5 |
| 6,543,038 B1 | 4/2003 | Tetelbaum | |
| 6,543,041 B1 * | 4/2003 | Scheffer et al. | 716/10 |
| 6,584,602 B2 * | 6/2003 | Ko | 716/4 |
| 6,594,805 B1 * | 7/2003 | Tetelbaum et al. | 716/5 |
| 6,637,014 B2 * | 10/2003 | Casavant | 716/6 |
| 6,665,845 B1 | 12/2003 | Aingaran et al. | |
| 6,721,930 B2 * | 4/2004 | Sasaki et al. | 716/6 |
| 6,760,895 B2 * | 7/2004 | Ito et al. | 716/10 |
| 2003/0229873 A1 | 12/2003 | Casavant | |

OTHER PUBLICATIONS

A. Kahng et al., Wiring Layer Assignments with Consistent Stage Delays, Proceedings of the 2000 international workshop on System–level interconnect Prediction, pp. 115–122, Apr. 2000.*

* cited by examiner

Primary Examiner—A. M. Thompson
(74) Attorney, Agent, or Firm—Fitch, Even, Tabin & Flannery

(57) ABSTRACT

A system, method and program product for designing integrated circuits. A design of an integrated circuit (IC) is analyzed to identify the longest path between each pair of registers. A crosstalk overhead is calculated for each identified longest path using a stochastic model. The crosstalk overhead of each longest path is added to selected path delays as an incremental port of register set up time. Any path wherein the sum of the path delay and crosstalk overhead exceeds a maximum accepted delay, i.e., where slack is less than or equal to zero is redesigned and the IC is then, placed and wired. The stochastic model may be a tree-like structure derived from several completed integrated circuit (IC) designs, in particular from cell placement and wiring for the completed IC. The tree-like stochastic model corresponds crosstalk delays to technology wire factors.

29 Claims, 7 Drawing Sheets

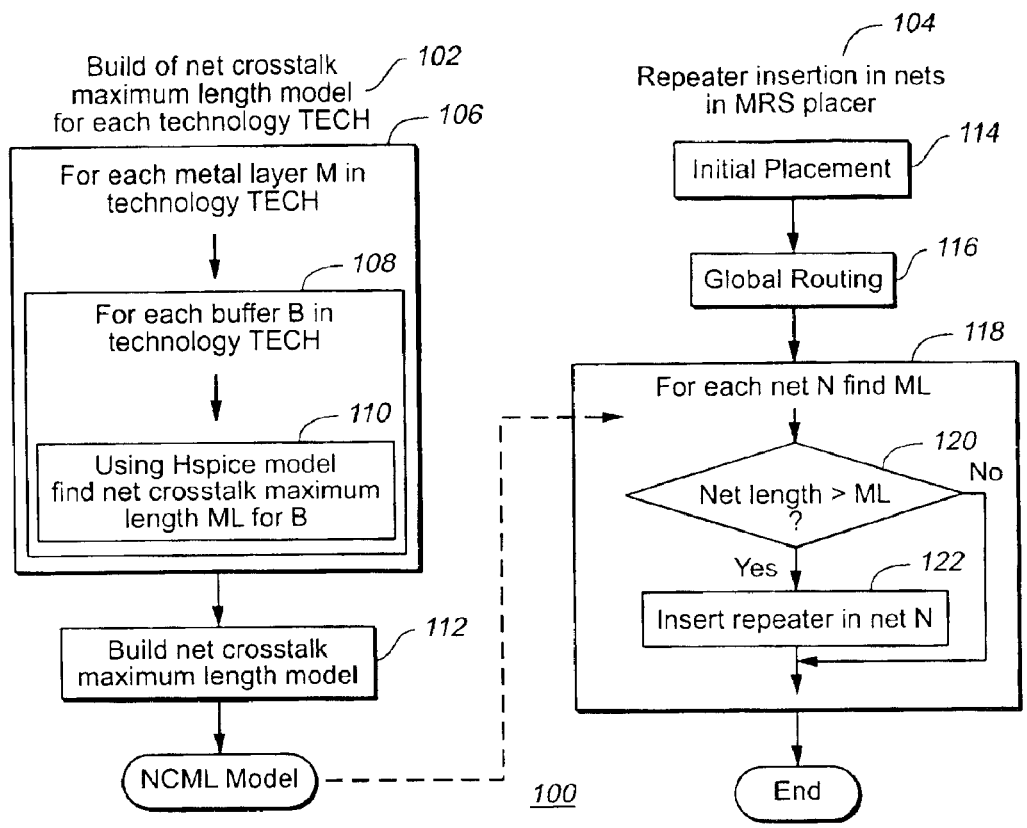
FIG._1
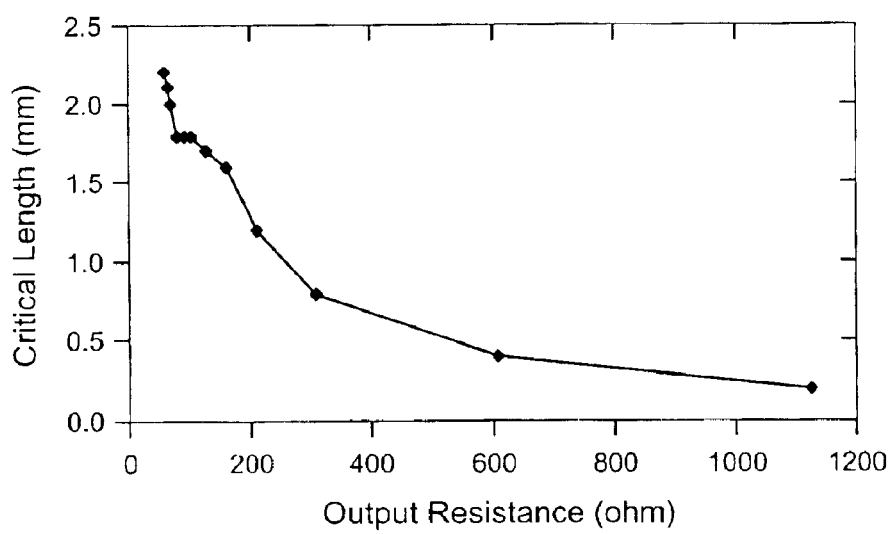
FIG._2

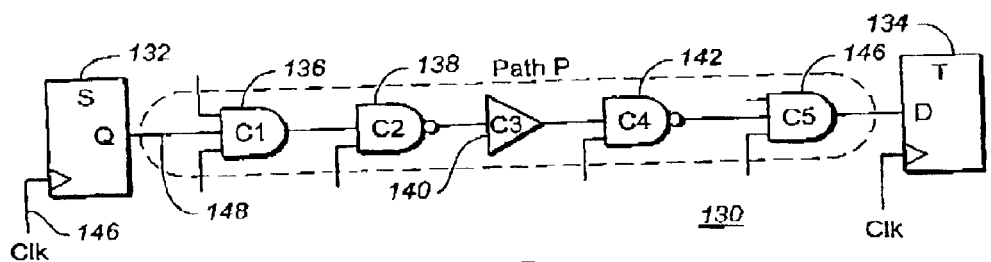
FIG._3
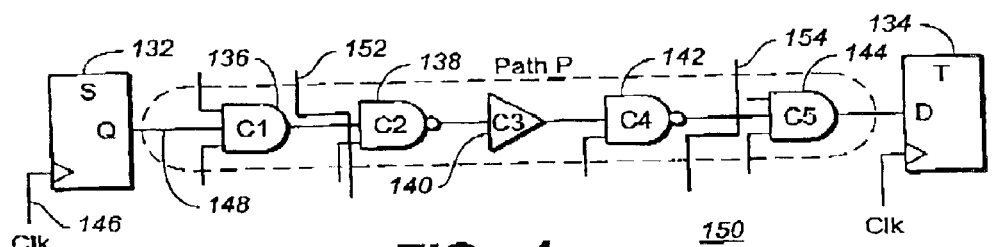
FIG._4
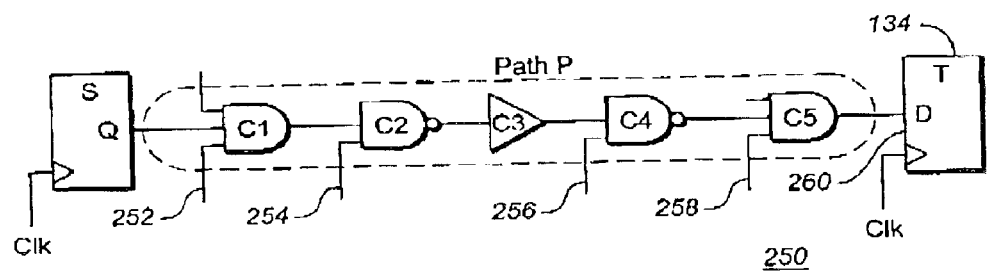
FIG._9

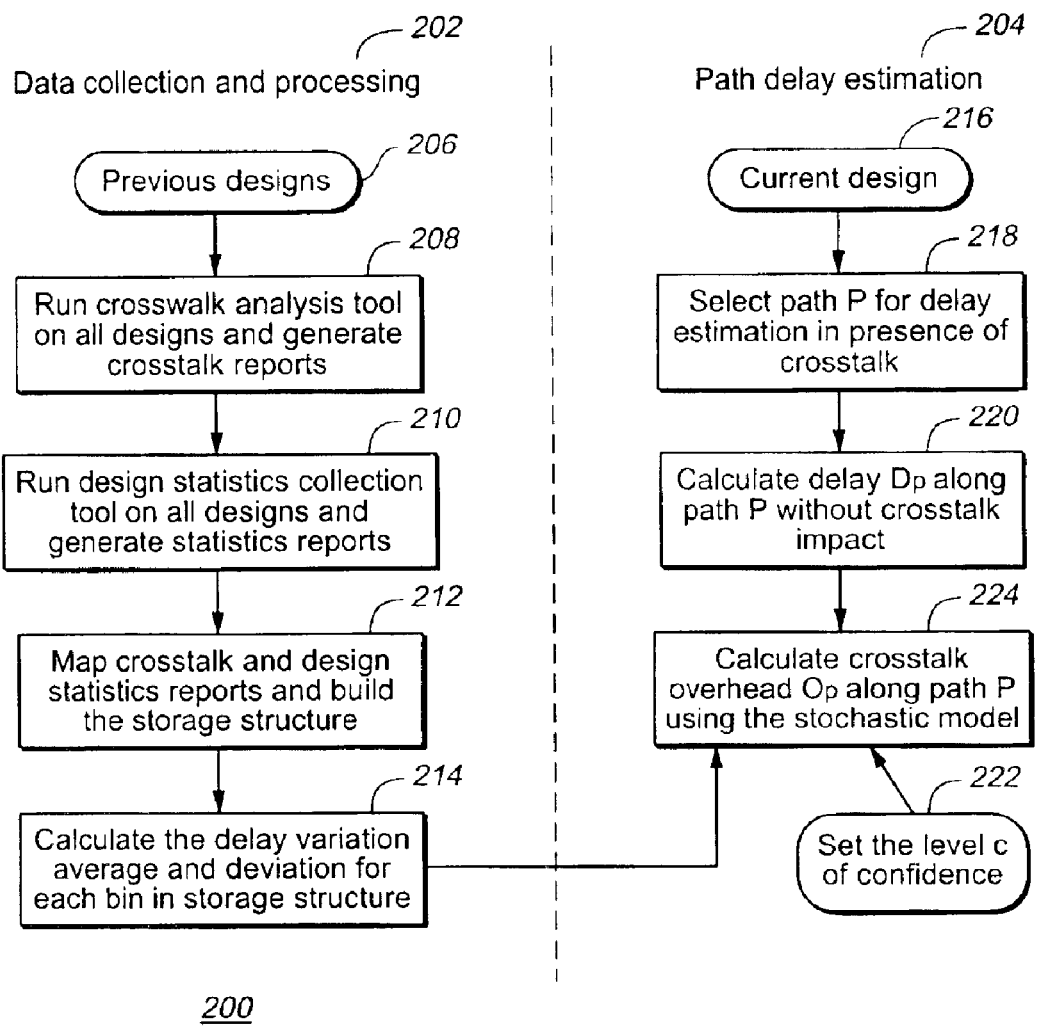
FIG._6

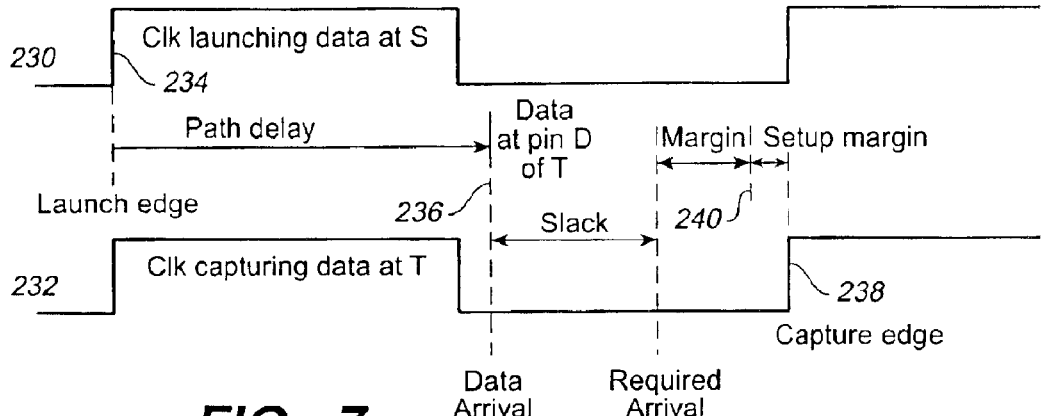
FIG._7
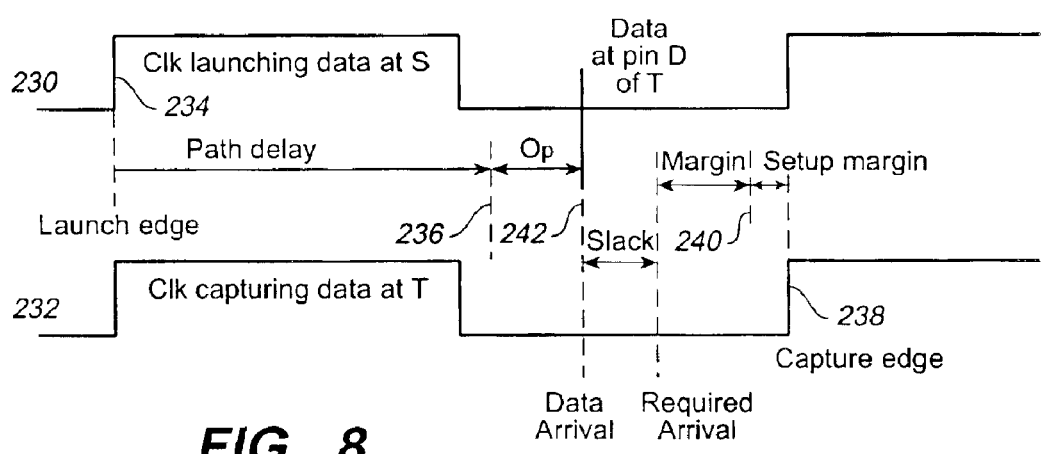
FIG._8
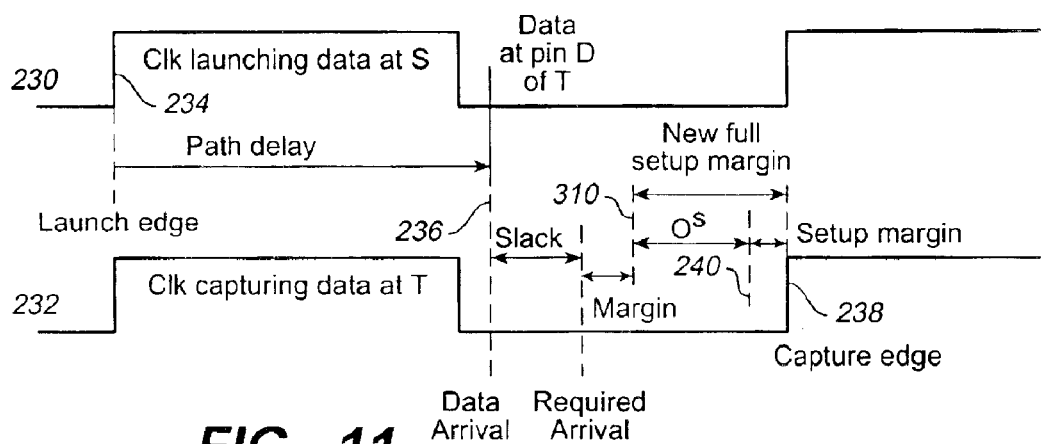
FIG._11

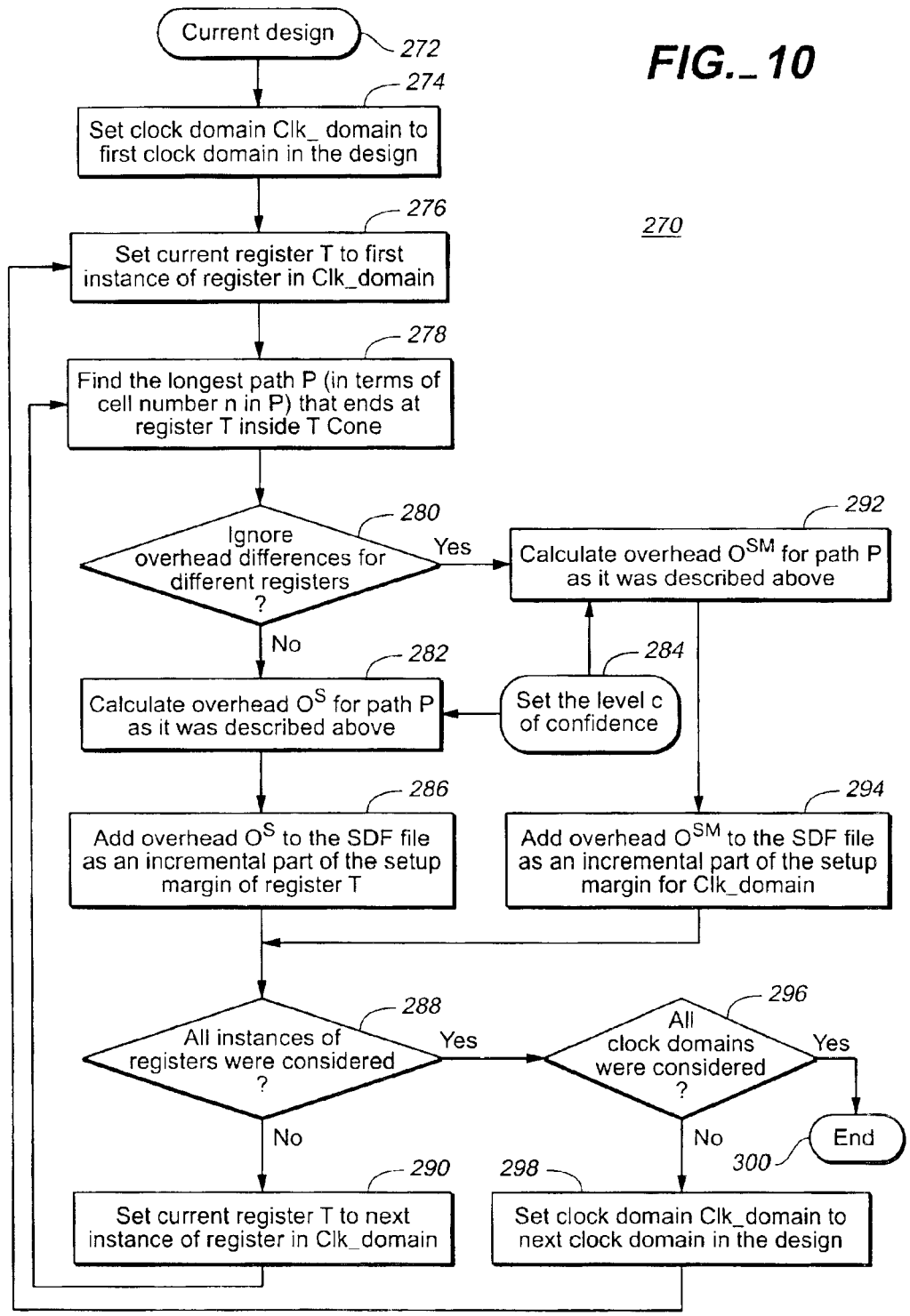
FIG._10

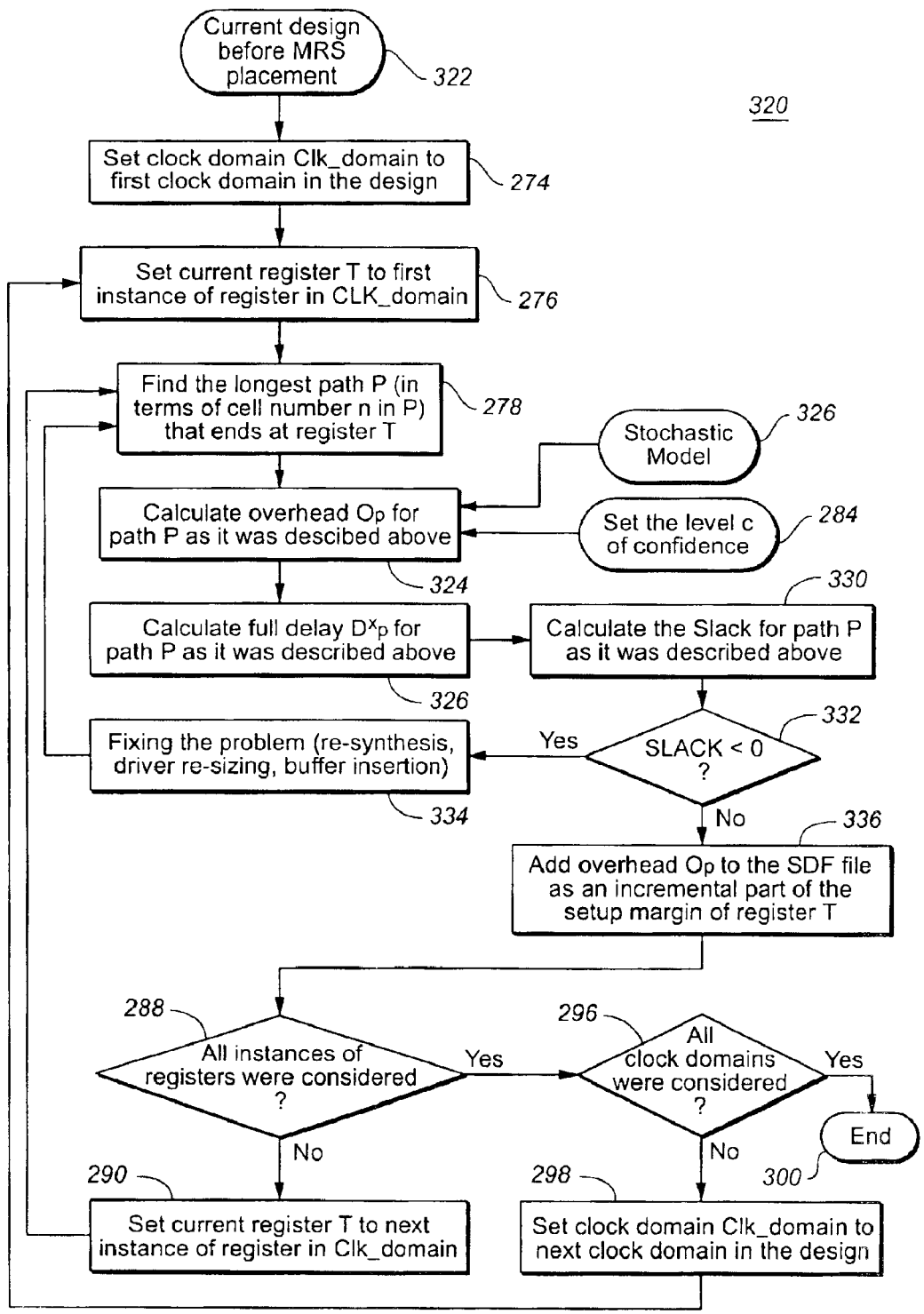
FIG._12

INTEGRATED DESIGN SYSTEM AND METHOD FOR REDUCING AND AVOIDING CROSSTALK

CROSS-REFERENCE TO RELATED APPLICATIONS

This application is related to U.S. patent application Ser. No. 09/968,008 entitled "AN INTEGRATED CIRCUIT DESIGN SYSTEM AND METHOD FOR REDUCING AND AVOIDING CROSSTALK" of M. Al-Dabagh et al., filed concurrently herewith and assigned to the same assignee.

BACKGROUND OF THE INVENTION

1. Field of the Invention

The present invention is related to noise avoidance in logic design and more particularly to reducing noise in integrated circuit logic chip designs.

2. Background Description

Noise problems caused by cross coupling effects (crosstalk) from runs of parallel integrated circuit wires are well known in the art, especially for application specific integrated circuits (ASICs) designed in technologies based at 0.18 micrometers (microns) and below. Crosstalk can result in incorrect logic responses and, in the extreme, chip failure. Accordingly to identify potential crosstalk, circuit analysis tools such as GateScope™ from Moscape, Inc. have been developed.

However, typically, these state of the art crosstalk analysis programs identify crosstalk errors only after circuit cell placement and wiring has been completed. At this point in the design, once crosstalk problems are identified, correcting crosstalk problems may require significant effort, e.g., re-placing cells and rewiring circuits or re-buffering individual clocks and perhaps even redesigning the logic to split affected nodes. Accordingly these prior approaches are time consuming and still may not lead to an acceptable chip design in a reasonable period of time.

Thus, there is a need for identifying potential crosstalk in integrated circuit designs.

SUMMARY OF THE INVENTION

The present invention is a system, method and program product for designing integrated circuits. A design of an integrated circuit (IC) is analyzed to identify the longest path between each pair of registers. A crosstalk overhead is calculated for each identified longest path using a stochastic model. The crosstalk overhead of each longest path is added to selected path delays as an incremental port of register set up time. Any path wherein the sum of the path delay and crosstalk overhead exceeds a maximum accepted delay, i.e., where slack is less than or equal to zero is redesigned and the IC is then, placed and wired. The stochastic model may be a tree-like structure derived from several completed integrated circuit (IC) designs, in particular from cell placement and wiring for the completed IC. The tree-like stochastic model corresponds crosstalk delays to technology wire factors.

It is a purpose of the present invention to eliminate crosstalk from integrated circuit chips;

It is another purpose of the present invention to identify potential sources of crosstalk in an integrated circuit chip design prior to placement and wiring;

It is yet another purpose of the present invention to reduce the number of placement and wiring iterations required in integrated circuit design.

BRIEF DESCRIPTION OF THE DRAWINGS

The present invention is illustrated by way of example and not limitation the accompanying figures in which like references indicate similar elements and which:

FIG. 1 is a flow diagram of an initial crosstalk reduction step of the preferred embodiment of the present invention;

FIG. 2 is a graph showing comparison of cell output driver output resistance verses critical wire length;

FIG. 3 is an example of a cross-section of a logic path between a starting register and a terminating register;

FIG. 4 is an example of the logic cross section with aggressor wires included;

FIG. 6 shows a flow diagram exemplary of a step of generating average per stage crosstalk related delays for a coarse pre-wiring crosstalk analysis model;

FIG. 7 is an example of a timing diagram for a typical path timing relationship between a start register and a terminal register;

FIG. 8 shows inclusion of crosstalk overhead in path delay analysis for a closer, more accurate arrival time estimate;

FIG. 9 shows a Tcone path for a terminal register;

FIG. 10 shows an example of a refinement step for setting and adjusting timing margins for path crosstalk delay analysis;

FIG. 11 shows a timing diagram illustrating an incremental addition of the crosstalk overhead value to the setup margin as a result of the identified crosstalk setup overhead;

FIG. 12 shows an example of a flow diagram of the preferred embodiment crosstalk management method wherein a stochastic crosstalk model is applied to analyze a design prior to cell placement.

DESCRIPTION OF PREFERRED EMBODIMENTS

Figure 5:
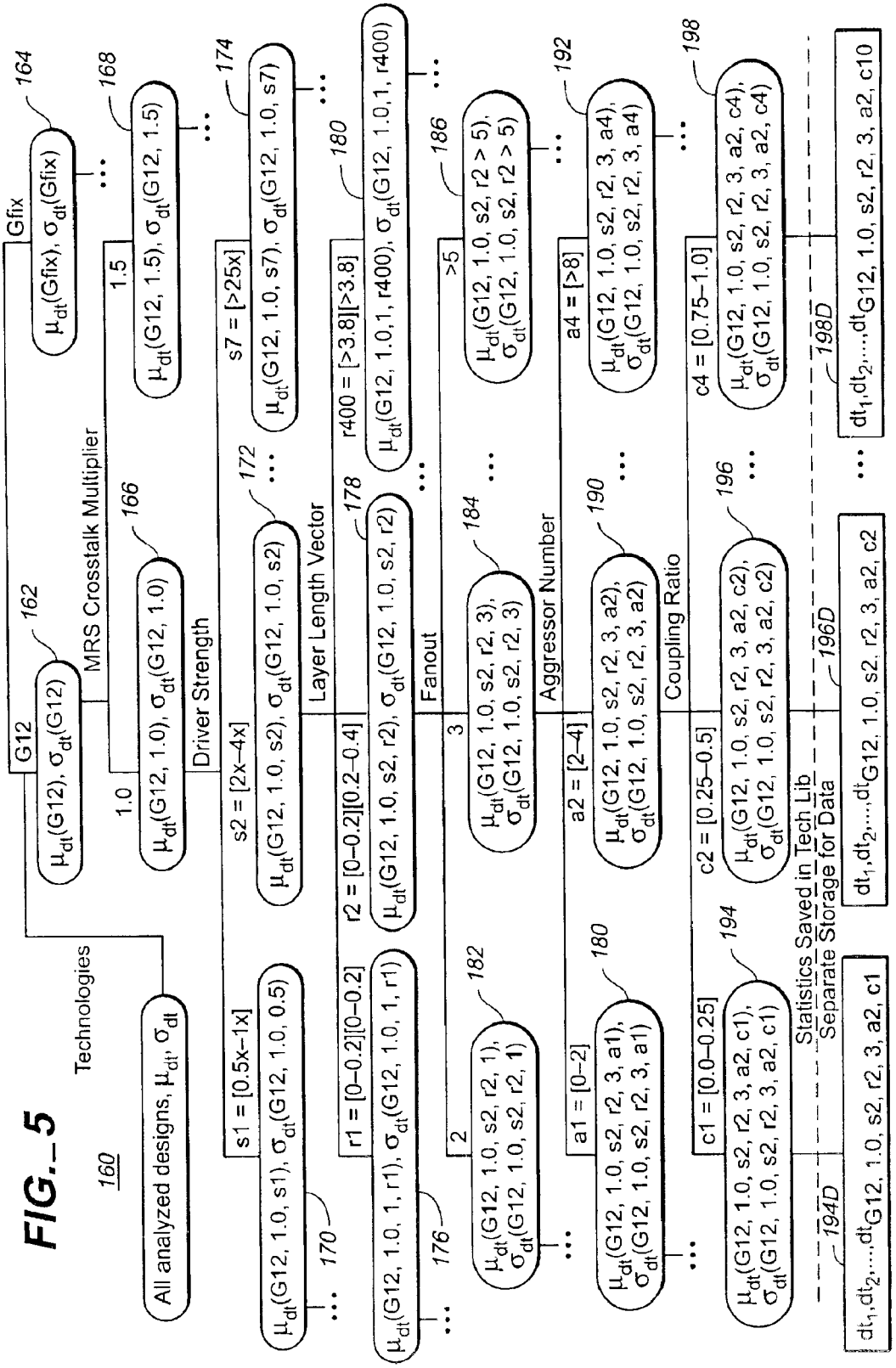
FIG. 5 shows an example of a tree-like classification structure.

Turning now to the drawings and, more particularly, FIG. 1 is a flow diagram of an initial or coarse crosstalk reduction step 100 of the preferred embodiment of the present invention. This global crosstalk reduction step includes two major steps. The first major step 102 is a predesign phase or step, wherein wires are characterized for a particular technology to determine a critical length for wires at each level. The second major step 104 is a segmentation step wherein, after placement, repeaters or buffers are inserted into any nets that have a total wire length greater than a technology defined critical length prior to cell wiring, thereby heading off any crosstalk that might otherwise occur.

So, first, a net crosstalk maximum length (NCML) model is generated in step 102 from existing designs. For each cell in each design a given crosstalk delay uncertainty (CDU) is assumed, e.g., 100 picoseconds (100 ps). The CDU is selected to be maintained within a specified design margin, for a particular cell library, in the particular technology selected. The NCML model is generated using worst case power, worst case voltage and worst case temperature, as applied to the situation wherein two aggressor nets (nets inducing noise into the net being analyzed) run parallel to the victim (the net being analyzed). Using the well known principle of superposition, wires are alternately victims (e.g., when being analyzed for NCML) and, otherwise, aggressor. Further, during this analysis the victim net is taken to switch simultaneously with only one aggressor. Iteratively considering every cell in the cell library, a maximum length is characterized depending on the fan out of the net and the metal loading of the net, as defined by the net length and cell drive.

Thus, in first step 102 for each design being analyzed, each metal layer is selected for characterization in step 106. Next, in step 108 buffer instances are identified for the design. Then, in step 110 the net crosstalk maximum length is identified for that buffer. In step 112 the net crosstalk maximum length model is generated for that technology and is a function that relates wire critical length to cell output resistance as described hereinbelow.

After the net crosstalk maximum length model is generated for a particular technology, it may be applied to nets in new designs in segmentation step 104. So, in step 114 an initial placement is made for a new design. Continuing to step 116 a global wiring routing is done for that initial placement to find a coarse locational relationship between cells in the same nets. In step 118 a maximum length is generated for each routed net using the NCML model. In step 120 each net is checked to determine if it exceeds the maximum length for that net. Any net exceeding the maximum length is segmented and a repeater is inserted between net segments in step 122. After inserting repeaters, the likelihood of crosstalk has been significantly reduced and wiring may continue as normal.

FIG. 2 is a graph showing the critical length of wires as a function of output resistance (which is technology dependent) for the cell driving the wire.

Since drive transconductance for a driver is represented by $$\frac{1}{R_{out}},$$

where $R_{out}$ is the output resistance exhibited by the driver cell, the cell output resistance is an indication of drive strength for the cell. Thus, output resistance corresponds to an acceptable maximum net length, i.e., an upper limit to the distance between cells on the same net. Additionally, critical length is technology dependent and, more particularly, in any technology critical length depends upon the wiring layers for the particular wire. Thus, a wire on a second level of metal which has a narrow pitch may have a shorter critical length, e.g., 2.4 millimeters, than a wire on an upper level of metal, such as a fourth level of metal which has a wider pitch and so, may have a critical length of 4 millimeters.

Therefore, the relationship between the output resistance and the maximum length (ML) for a net may be described by the relationship $$ML = \frac{1}{f(R_{out})}.$$

In particular, $f(R_{out})$ may have the form of a simple linear equation to a close approximation, i.e., $f(R_{out}) = a \times R_{out} + b$ and, therefore, $$ML \cong \frac{1}{aR_{out} + b}.$$

Table 1 below shows a comparison example of coefficient a and offset constant b for both wires on a second layer of metal (M2) and on a fourth layer of metal (M4), each being driven by a cell having a drive resistance of 65Ω. The maximum length for a wire entirely on M2, for the example of Table 1, is 2.4 millimeters and, 4 millimeters for M4. Accordingly, the ML may be determined for a given driver driving a wire on any selected level or combination thereof using the above relationship in combination with an appropriate technology table, such as Table 1. Then, for a rough cut, nets that exceed the maximum length for a particular level or, for a combination of levels are segmented and drivers are inserted between the segments to reduce the level of crosstalk in the net segments.

TABLE 1

|    | a        | b        | ML for buff |
|----|----------|----------|-------------|
| M2 | 0.004189 | 0.144669 | 2.4 mm      |
| M4 | 0.004371 | 0.0239   | 4 mm        |

Thus, having identified any nets that exceed the maximum length, segmenting those nets and inserting repeaters between most segments, crosstalk concerns have been attenuated. Thus, the initial crosstalk reduction step of FIG. 1 provides an excellent first cut to eliminate the majority of crosstalk errors and, in many cases, may be sufficient that running crosstalk analysis tools on a subsequently wired final design does not identify any crosstalk sensitivities. However, there are other ways in which crosstalk still may effect the circuit performance.

FIG. 3 is an example of a logic cross-section path 130 between two registers, starting register 132 marked with an S and a terminating register 134 marked with a T. Further, the path 130 includes several cells 136, 138, 140, 142 and 144, representative of logic gates in any typical logic path. Normal circuit design analysis provides propagation delays between the start register 132 and the terminating register 134 based on cell or gate delays (cell input to output) and delays for wiring between the gates. In the absence of crosstalk (the normal design analysis assumption for prior art logic design systems) the propagation delay along path 130 is approximated as a sum of the cell delays and any wiring delays between cells. Thus, path propagation delay can be represented as:

$$D_P = T_{S(Clk,Q)} + \sum_{i=1}^{n}(T_{W(Out_{i-1},In_i)} + T_{C(In_i,Out_i)}) + T_{W(Out_n,D_T)}$$

where $T_{S(Clk,Q)}$ is a delay through register 132 from Clk input 146 to Q output 148; $T_{W(Out_{i-1},In_i)}$ is the wire delay between the output of cell i–1 and the input to cell i; and $T_{C(In_i,Out)}$ is the cell delay from input to output of cell i. Normally, design proceeds, placing gates and then wiring the gates after placement.

The wired circuit 150 of FIG. 4 is identical to the originally designed circuit 130 of FIG. 3, except aggressor wires 152, 154 have been added during wiring. Wiring analysis is done on a resulting placed and wired circuit such as this. Crosstalk from these aggressor wires 152, 154, may increase or decrease wiring delays $T_W$ in the path by some value (dt) which may be a function of several wire factors, i.e., dt(WireFactor). Each net can be wired through several different available wiring layers. State of the art delay estimation and crosstalk analysis tools calculate pin-to-pin wire delays between cells within the net.

Wiring delays $T_W$ within any path are affected by several wiring factors which also affect crosstalk. Typically, these factors may be categorized to include a technology dependency factor, a driver strength factor, a factor that is representative of the strength of the driver driving the cell (as indicated by the driver resistance or transconductance), the wire's layer lengths on each particular layer, the net fan out, existence of any wires adjacent to the net, and the number of potential aggressors (i.e., the number of adjacent wires). These are all considered in a normal crosstalk evaluation of the wired design. Further, an aggressor coupling ratio is the ratio of total aggressor length to the wire, which is yet another factor. In addition, a crosstalk multiplier may be included to analyze the overall effect of crosstalk on the particular net. This additional crosstalk delay (dt) can be inserted into the above delay equation to result in a more representative relationship:

$$D_P^X + T_{S(Clk,Q)} + \sum_{i=1}^{n} (T_{W(Out_{i-1},In_i)} + dt_i(WireFactors) + T_{C(In_i,Out_i)}) + T_{W(Out_n,D_T)}$$

Where $dt_i$(WireFactors) provides additional crosstalk delay with respect to all of the above mentioned wiring factors. Accordingly, it is understood that if crosstalk acts to reduce delays, crosstalk is not a problem and need not be considered. Therefore, for the worst case scenario crosstalk is taken to increase the path delay, for example, to the point where insufficient time is provided prior to clocking terminating register T. Thus, the delay difference (dD), between an initial design and the final placed and wired circuit is simply the difference between the above two equations, i.e., $$dD = D_P^X - D_P = \sum_{i=1}^{n} dt_i,$$

So, this path crosstalk delay difference dD for any path is a function of the wire factors for the wires within that path and, may vary for each path and for different critical paths. This difference may be characterized for a particular technology from previously established chip designs and, by varying wire factors for each characterized chip design, a mean value for a wire delay adder ($\mu_{dt}$), as well as a standard deviation ($\sigma_{dt}$), may be derived for each particular technology and any particular chip. Further, these chip mean values and standard deviations may be processed statistically to derive an overall mean value and standard deviation for a particular technology which may then be applied to subsequent designs to project expected crosstalk delay on individual nets.

In particular, the path delay may be modeled taking into account a crosstalk delay overhead ($O_P$) on an N cell path. The path delay in the presence of crosstalk can be represented as $$D_P^X = D_P + O_P$$

where the crosstalk delay overhead is $$O_P = \sum_{i=1}^{n} \mu_{dt}(WireFactors) + c \cdot \sqrt{\sum_{i=1}^{n} \sigma_{dt}^2(WireFactors)}$$

where: $\mu_{dt}$ (WireFactors) is the mean value of the wire delay addition dt for each wire with respect to wiring factors; $\sigma_{dt}$ (WireFactors) is a standard deviation of the value of dt; and, c is the design confidence level. So, for example, c=1 selects the one a confidence level at 87% confidence, c=2 selects the two a confidence level at 97% confidence and c=3 selects the three σ confidence level at 99% confidence. Thus, having derived the mean and standard deviation of crosstalk delay additions, delay through each path including crosstalk may be determined with a 99% confidence level for each path.

Thus, crosstalk may be calculated for all nets prior to wiring, and, if necessary, path adjustments may be made to reduce delay through a particular path to maintain critical timing within design constraints for all paths on the same chip. Further, since during the initial design stages, both prior to placement and during placement, most of the wire factors are unknown, e.g., individual net lengths and wire layers used for each net. So, an abbreviated wire factors list may be used for a quick initial delay calculation. For example, for an initial calculation, wire factors may be restricted to driver strength, layer length, fanout, aggressor number and coupling ratio. Also, some wire factors may change during design, e.g., net fanout during resynthesis, driver strength of the net from cell resizing or, even, net length as a result of re-placement or rerouting the net. So, this initial abbreviated list provides sufficiently comprehensive analysis at these initial design stages.

Thus, wiring data statistics may be collected to relate wiring factors to delays for a particular technology and, then periodically, the statistics are updated and maintained for that technology. For this purpose, the collected statistics may include individual net crosstalk delays from a particular design (for example {$dt_1$, $dt_2$, ...}), the average of those crosstalk delays, as well as the mean crosstalk delay value ($\mu_{dt}$) and standard deviation value $\sigma_{dt}$ which are both functions of wire factors. These delays are binned according to related wire factors and both the tree-like binning structure and the delays are saved for subsequent use and analysis. It should be noted that raw crosstalk delay data, i.e., {$dt_1$, $dt_2$, ...} may be saved independently of, and separately from the computed wire factor mean and standard deviation values. Thus having computed the mean of the standard deviation values, a statistical representation has been extracted which may be used to predict the expected crosstalk delay for any number of cells or stages between two cells (starting and terminating cells) in any path. Then using these representative values, the crosstalk delay overhead may be predicted for any path of n cells, in particular using the relationship:

$$O_P^S = n \cdot \mu_{dt} + c \cdot \sqrt{n} \cdot \sigma_{dt}.$$

As a result, by considering each wire independently and using chip average WireFactor parameters, a close estimate of the path crosstalk is achieved such that crosstalk is predicted within a desired degree of confidence prior to placement and wiring.

FIG. 5 shows an example of a cross-section of the above described tree-like classification structure 160 which may be constructed using the particular wire factors selected. The number of classification bins in the tree-like structure 160 corresponds to the number of wiring factor variables selected and the number of possible results for each of the wiring factors. Thus, for six wiring factors described above, i.e., technology, placement multiplier, buffer strength, layer length, fanout, number of aggressors and coupling factors, the number of bins is the product of each number of possibilities for each of the wire factors and the structure may have the general appearance of the example shown in FIG. 5. Accordingly, by constraining the particular wire factors selected and the granularity within each wire factor the number of bins may be managed to a reasonable number.

For example, the number of technologies may be held to two 162, 164, respectively, labeled G12 and Gflx in this example. Crosstalk multipliers may be constrained to two 166, 168, corresponding to a normal delay (unity) or a relaxed crosstalk delay at a 1.5 multiplier. Seven different buffer strengths may be selected represented by bins 170, 172, 174, corresponding to a minimum buffer strength of 0.5 to 1×, or buffer strength ranges of 2× to 4×, 5× to 8×, 9× to 12×, 11× to 15×, 16× to 25×, and greater than 25×, respectively, to provide for increasing buffer drive depending upon the expected load for a particular net. Layer length vector bins may be selected based on an expected maximum layer length. For example, 81 layer length vector bins represented by bins 176, 178, 180 may be selected to segment an expected maximum length of 4 millimeters, into nine 0.5 mm bins for each of nine individual layer length value ranges. Fanout can be constrained by design, however, fanout bins 182, 184, 186, typically, will cover ranges from one or two up to more than five. Aggressor number range bins 188, 190, 192, typically, can be selected for as many aggressor ranges as are deemed appropriate, such as 0 to 2, 2 to 4, 4 to 6 and more than 6. Coupling ratios which are dependent upon the victim and aggressor wire layers can be constrained to, for example, four coupling ratio bins represented by bins 194, 196, 198, each coupling ratio bin corresponding to one of a range from 0.0 to 0.25, 0.25 to 0.5, 0.5 to 0.75, or 0.75 to 1.0. It is understood that this WireFactor tree and associated wire factors are provided for example only and not intended as a limitation.

So, for this example the number of bins N=2×2×7×81× 5×4×4=181,440 bins, (i.e., 2 technologies×2 crosstalk multiplier ranges×7 buffer strength ranges times 81 layer length vector ranges×5 fanout ranges×4 aggressor ranges×4 coupling ranges) a small number by comparison to the number of cases considered by prior art analysis methods. Continuing this example, an average design containing on the order of three million wires, collecting statistics for 10 completed designs provides an average of 150 wires from each design in each of the nearly 200,000 bins and may be considered as representative data. At the bottom of the tree, the crosstalk data 194D, 196D, 198D is grouped for each bin. Each bin 194D, 196D, 198D is defined by walking through the tree to a bottom classification bin.

FIG. 6 shows a flow diagram 200, exemplary of the this phase of the preferred embodiment of the present invention wherein, average per stage crosstalk related delays are generated in major step 202 and included in the model for subsequent prewiring crosstalk analysis for new designs in step 204. First, in step 206, previous designs in a particular technology are collected. In step 208 crosstalk analysis is conducted on the selected previous designs and crosstalk reports are generated for those designs. In step 210, design statistics are collected from the crosstalk reports and statistics reports are generated. In step 212 the crosstalk and design statistics are mapped to particular bins and the tree-like storage structure is created. In step 214 crosstalk delay mean and standard deviation values are generated for each bin in the storage structure. These mean and standard deviation values are outputs from first major step 202 passed to the second major step 204 for use in subsequent delay calculations. In step 216, a new design is presented for analysis. In step 218 each path of the new design is selected, one by one, and each selected path is analyzed for crosstalk affects. In step 220 the raw delay $D_P$ along the path is calculated, i.e., without consideration of crosstalk. In step 222 a statistical crosstalk overhead along the selected path is generated using the mean and standard deviation generated from step 202. The confidence level is set in step 222 and the result is passed to step 224 wherein crosstalk overhead is calculated for the selected path. Based on this initial analysis, potential problems may be identified and the design may be modified to eliminate those errors prior to wiring.

FIG. 7 is a timing diagram showing an example of a typical path timing relationship between a start register 132 and a terminal register 134 as in FIGS. 3 and 4. The start register 132 is set by clock 230 and the terminating register 134 is set by clock 232. Clock launching edge 234 latches data into the start register 132, passing latch data out of the start register 132 to initiate signal propagation through the path P. The signal propagates through the path logic, emerging from the logic at the input pin D of the terminating register 132 at data arrival time 236. Capture edge 238 is the clock edge upon which the path datum latches into the terminating register 134. Typically, each flip flop or register requires a period of time known as the setup margin 240 after which data into the register must be maintained at a constant value in order for the register to latch correctly. Also, typically, designs include a safety margin, some requisite advance data arrival time indicated by dashed line 242, in addition to the setup time at which time, the data path output is required to remain at a constant level. This safety margin is sometimes referred to as design margin and is included to compensate for process, voltage and temperature (PVT) variations, as well as delay variations from crosstalk between nets and further for inaccuracies in design models and process model algorithms. The excess time between the arrival of an input signal from the path at 236 and the required arrival 240 is known as the slack for the particular data path and is different for each path.

Critical paths are those paths where the slack is zero or close to zero for a particular design and may further include paths wherein slack falls below a design minimum for the design. Normally, the design margin is selected to accommodate for uncertainty in the design due to clock edge arrival, power supply voltage variability and for process variations. Setup margin usually is a constant for each particular technology, e.g. 10% of the clock period. Although normally a design consideration, for purposes of describing the present invention, clock skew is ignored and is treated as zero. Thus, as described herein slack is defined as the required input arrival time (i.e., clock edge–setup margin) minus the expected data arrival time and, is never allowed to be less than zero.

For any clock domain within a design, the design margin depends in large part on the particular design technology. If PVT, delay and other design parameter variations require increasing the margins then path delays must also be reduced in order to compensate. So, any change in the margins for one path constrains all paths in the clock domain for the particular technology. For non-critical paths that have a small path delay value and large slack this may be acceptable. However, this tighter constraint is not acceptable in critical paths. Further, some paths that may not be critical prior to slack reduction and may become critical because of the reduced slack.

Accordingly, path crosstalk delays may be considered in early design stages by adjusting design and setup margins during physical design to anticipate likely crosstalk. This minimizes the impact to the finally placed and wired design to within a selected level of confidence or certainty. Thus, running expensive time-consuming design analysis tools after wiring a design is no longer a design requirement because crosstalk design violations have been avoided to within that level of certainty.

So, the setup margin may selectively be changed for any particular register (or flip flop) such as the terminating register 134. For each register, the setup margin may depend upon the technology, the clock domain and the maximum number of cells among all paths ending in that terminating register. By increasing the required register setup margin, the acceptable delay is reduced through all paths ending in that register. However, only those paths that have path delays long enough that the margin becomes insufficient (i.e., slack becomes negative) as a result of this change need be considered for further analysis as requiring timing adjustment or redesign. Typically, shortening either of the setup or design margins places additional constraints on cells within the path or within the paths to the register being considered. Meeting those additional constraints may require, for example, increasing cell power levels in one or more cells. This increased setup margin analysis may be done using a Standard Delay Format (SDF) file for a particular design by introducing an incremental addition to the setup margin for one or more particular flip flops or registers being considered. One present drawback to this approach is that any change in setup margin constrains all paths. However, the preferred embodiment of the present invention more precisely determines the likely delay through any particular path because, individual setup times and margins are assigned to individual registers or flip flops in individual paths.

First, using the above described method 200 of FIG. 6, a crosstalk overhead is calculated for each path. As represented in FIG. 8, crosstalk overhead can be inserted into the path delay to get a closer more accurate estimate of the actual arrival time and so, a truer estimate of the slack available in each path. This estimate is more accurate because uncertainty is removed by adding more representative crosstalk overhead to the original data arrival edge 236 to provide an updated data arrival edge 242. So, the slack value, may be reduced because crosstalk overhead no longer must be considered as an unknown delay factor, since expected crosstalk is no longer an unknown or an unquantifiable value for the path.

FIG. 9 shows a path 250 terminating in terminal register 134, including paths indicated by arrows 252, 254, 256, 258 and 260 that are of various lengths representative of path delays, figuratively referred to as the Tcone 262 of the path. Sensitivity to crosstalk in the path 250 is inversely proportional to the closeness to the terminating register 134 at which the particular Tcone path 252, 254, 256, 258, 260 merges with main path 250. Thus, path 252 is more sensitive to crosstalk than path 254, etc. So, the preferred embodiment crosstalk delay estimator of the present invention determines a delay overhead for each Tcone path to assist in developing a crosstalk delay margin guideline. In particular, each register or flip flop is considered for each clock domain and for each considered register, the longest path terminating in the register is identified. The setup crosstalk overhead for terminating register can be identified using the relationship $$O^S = \max\{O_P^S(n)\} = O_P^S(n_{max})$$

where $n_{max}$ is the largest number of cells in one path of all the paths in the Tcone of the particular register.

FIG. 10 shows an example of an additional refinement step 270 for setting and adjusting timing margins of a design according to the present invention. The design is input in step 272. In step 274 the clock domain variable CLK_domain is set to point to the first clock domain in the design. In step 276 the first instance of a register in the current clock domain is selected as a terminating register. In step 278 traversing back from the terminating register, a Tcone paths is identified. In step 280 a check is made to determine whether the simplified analysis is to be run wherein overhead differences for different registers are to be ignored. If not, continuing to step 282 the crosstalk overhead is calculated for the path using the selected confidence level in 284. Then, in step 286 the calculated overhead is added to the SDF file as an incremental part of the setup margin for the current selected terminating register. In step 288 a check is made to determine whether all instances of registers were considered. If additional registers remain to be considered then in step 290 the next register instance is set as a current terminating register and returning to step 278 that next register is considered. If, in step 280 the simplified margin is indicated such that overhead differences for different registers are to be ignored, then, in step 292 the simplified overhead margin is calculated for the path as described above, using the confidence level from 284. In step 294 that simplified overhead margin is added to the SDF file and provided as an incremental part of the setup margin for registers of the whole clock domain. In step 288 if all instances of registers have been considered, then in step 296 a check is made to determine whether all clock domains have been considered for the design. If not, in step 298 the current clock domain is set to point to the next clock domain and, returning to step 276 the first instance of a register for that clock domain is selected. Once it is determined in step 246 that all clock domains have been considered, then, the design is complete in step 300.

FIG. 11 shows a timing diagram illustrating an incremental addition of the crosstalk overhead value to the setup margin as a result of the identified crosstalk setup overhead. As noted above, the crosstalk setup overhead is an incremental addition to the setup margin in the SDF file. Thus, the crosstalk setup overhead as represented by the gap between timing edges 310 and 240 may be included in the design to define the relationship $$\text{New setup margin} = \text{Library setup margin} + O^S$$

which reduces uncertainty as well as both slack and margin.

This crosstalk overhead setup can be simplified by ignoring crosstalk overhead differences for registers, wherein simplified margin ($O^{SM}$) is defined by the relationship $$O^{SM} = \max\{(O_P^S(n)\} = O_P^S(n_{max}) P \in \text{Design}.$$

As can be seen from the timing diagram of FIG. 11, the new margin can be defined as the combination of the old margin and the simplified crosstalk setup overhead.

Having thus developed the crosstalk delay model of the tree structure example of FIG. 5 and the method of extracting path crosstalk overhead of FIG. 6, the stochastic model may be applied prior to or during cell placement to account for potential crosstalk delays during placement, as well as to identify and fix potential violations prior to their occurrence. Thus, the impact of crosstalk delays on nets is minimized and bounded for critical paths within a selected confidence level. As a result, crosstalk analysis tools no longer need be run after the design is complete because crosstalk violations are extremely unlikely to remain in the final design. However, if desired additional crosstalk analysis may be conducted for an even higher degree of confidence.

FIG. 12, shows an example of a flow diagram 320 of the preferred embodiment crosstalk management and system design tool wherein the stochastic crosstalk model is applied to a design prior to cell placement in step 322. The flow diagram 320 includes several steps common to the flow diagram of FIG. 10 with identical steps being labeled identically. So, after the design is provided prior to cell placement continuing to step 274 a clock domain is selected. In step 276 the first instance of a register is selected and in step 278 the longest path ending in the selected register is identified. In step 324 the path overhead crosstalk delay is calculated using the stochastic model 326 (e.g., FIG. 5) for the level of confidence set in step 284. In step 326 the full delay for the path is calculated and, in step 330 the slack for the path is calculated, accounting for the overhead crosstalk delay for the path calculated in step 324. In 332, the slack is checked to determine if it is negative and, if so an indication is provided to the designer. At this point, the designer is provided with an option to fix the logic the design in step 334 using for example synthesis, driver resizing and/or buffer insertion. If the slack is greater than or equal to zero, then, in step 336 the path crosstalk delay overhead is added to the SDF file as an increment to the setup margin for the currently selected register. Continuing to step 288, a check is made to determine if all register instances have been considered. If not, the next register is selected as a current register in step 350 and returning to step 278 the longest path is checked for that register. Once, all instances of registers are found in step 288 to have been considered for the current clock domain; then, in step 296 a check is made to determine whether all clock domains have been considered. If not, in step 298 the next clock domain is set to the current clock domain. Then, returning to step 276 the first register in that clock domain is selected. Otherwise, if all clock instances have been considered, then in step 300 the analysis ends and crosstalk problems have been eliminated from the design.

Thus, potential crosstalk related problems are identified early, prior to wiring and, in particular, prior to initial or final placement, thereby avoiding potentially time consuming post design crosstalk analysis that may or may not lead to an acceptable design solution. Instead, a user knows within a selected level of confidence prior to placement that the finally placed and wired design will not have cross-talk problems or errors associated therewith.

While the invention has been described in terms of preferred embodiments, those skilled in the art will recognize that the invention can be practiced with modification within the spirit and scope of the appended claims.

What is claimed is:

1. A method of integrated circuit design comprising steps of:
   a) providing a design of an integrated circuit;
   b) calculating a crosstalk overhead for each path between register pairs in said design;
   c) identifying paths between register pairs having a path delay exceeding a specified acceptable maximum path delay; and
   d) redesigning any identified paths between register pairs such that redesigned paths have a path delay less than said maximum path delay wherein said crosstalk overhead in calculated in stop b) using a stochastic model comprising steps of:
   i) providing a plurality of completed integrated circuit designs for analysis;
   ii) selecting one of said completed integrated circuit designs;
   iii) selecting a metal wiring layer of said selected completed integrated circuit design;
   iv) finding a net crosstalk maximum length for said selected metal wiring layer;
   v) repeating steps iii) and iv) until each metal wiring layer of said selected completed integrated circuit design is analyzed;
   vi) repeating steps ii) through v) until each completed integrated circuit design has been analyzed, results of said analysis being stored for subsequent analysis; and
   vii) building said stochastic model, said stochastic model being a net crosstalk maximum length model.

2. A method as in claim 1 wherein the step c) of identifying paths comprises identifying a global net within said selected metal wiring layer having a distance between cells exceeding a net croostalk maximum length.

3. A method as in claim 2 wherein the net crosstalk maximum length model is applied to the integrated circuit design after cell placement to identify said global net, said identified global net being segmented in the redesign step d) and a repeater being inserted into said identified global net between segments.

4. A method as in claim 1 wherein said stochastic model is applied to paths in said selected completed IC design in step c) to identify crosstalk overhead in said paths between register pairs, said crosstalk overhead being applied to said paths between register pairs, and any path identified as exceeding a selected maximum being segmented and reanalyzed.

5. A method of integrated circuit design comprising steps of:
   a) providing a design of an integrated circuit;
   b) calculating a crosstalk overhead for each path between register pairs in said design;
   c) identifying paths between register pairs having a path delay exceeding a specified acceptable maximum delay; and
   d) redesigning any identified paths between register pairs such that redesigned paths have a path delay less than said maximum path delay; and
   (e) creating a stochastic model having a tree-like structure, said stochastic model being used in step b) to calculate said crosstalk overhead.

6. A method as in claim 5 wherein creating said stochastic model comprises steps of:
   providing a plurality of completed integrated circuit designs;
   analyzing said plurality of completed integrated circuit designs for crosstalk and storing the results of said analysis;
   generating crosstalk related design statistics on each of said plurality of completed integrated circuit designs;
   building said tree-like structure representative of design wiring factors;
   mapping said crosstalk related design statistics to said tree-like structure; and
   calculating statistical values relating said tree-like structure with crosstalk delays.

7. A method as in claim 6 wherein the step b) of calculating crosstalk overhead comprises steps of:
   i) providing said plurality of completed integrated circuit designs for crosstalk analysis prior to cell placement;
   ii) selecting a path within one of said plurality of completed integrated circuit designs for crosstalk analysis;
   iii) calculating path delay through said selected path;
   iv) categorizing said selected path according to said stochastic model, path crosstalk overhead delays being provided responsive to categories for said selected path for crosstalk analysis; and
   v) repeating steps i) through iv) until every path in said plurality of completed integrated circuit designs has been analyzed.

8. A method of integrated circuit design comprising steps of:
   a) providing a design of an integrated circuit;
   b) identifying a longest path between register pairs in said design;
   c) calculating a crosstalk overhead for each identified longest path between register pairs;
   d) for each of said register pairs, calculating a sum of said crosstalk overhead and a path delay of said longest path between register pairs; and
   e) redesigning said path between register pairs if the sum of the path delay and crosstalk overhead exceeds a maximum accepted delay wherein the step b) of identifying said longest path between register pairs comprises steps of:
   i) selecting a clock domain;
   ii) selecting a terminating register in said selected clock domain; and
   iii) counting cells in each path terminating in said terminating register.

9. A method as in claim 8 wherein the step d) of calculating a sum of crosstalk overhead and a path delay of said longest path between register pairs comprises inserting said calculated crosstalk overhead as an incremental part of setup time for the selected terminating register.

10. A method as in claim 9 further comprising a step of selecting a next terminating register after inserting the calculated overhead.

11. A method as in claim 10 further comprising a step of selecting a next clock domain after the next terminating register is selected.

12. A method as in claim 11 further comprising a step of redesigning paths after a crosstalk overhead is inserted for a last terminating register in a last clock domain as in step e).

13. A circuit design system comprising:
   modeling means for developing a stochastic model of a circuit design;
   crosstalk calculation means for calculating a crosstalk overhead for each path between register pairs in the circuit design responsive to said stochastic model; and
   path analysis means for identifying paths between register pairs having a path delay exceeding a specified acceptable maximum path delay.

14. A circuit design system as in claim 13 wherein said modeling means comprises:
   means for selecting one of a plurality of completed integrated circuit designs in a selected technology for analysis;
   means for selecting a metal wiring layer of said selected integrated circuit design;
   means for finding a net crosstalk maximum length for said selected metal wiring layer;
   means for storing results of said analysis for subsequent analysis; and
   means for building a net crosstalk maximum length model for said selected metal wiring layer.

15. A circuit design system as in claim 14 wherein said path analysis means comprises net length identification means for identifying a global net within said selected metal wiring layer having a distance between cells exceeding a net crosstalk maximum length.

16. A circuit design system as in claim 15 wherein said net length identification means identifies any global net exceeding the net crosstalk minimum length, segments said identified global net, and inserts a repeater into said identified global net between segments.

17. A circuit design system as in claim 13 wherein said modeling means develops a tree-like structure.

18. A circuit design system as in claim 17 wherein said modeling means comprises:
   means for selecting one of a plurality of completed integrated circuit designs;
   means for analyzing said plurality of completed integrated circuit designs for crosstalk and storing the results of said analysis;
   means for generating crosstalk related design statistics on each of said plurality of completed integrated circuit designs;
   means for building said tree-like structure responsive to design wiring factors;
   means for mapping said crosstalk related design statistics to said tree-like structure; and
   means for calculating statistical values relating said tree-like structure with crosstalk delays.

19. A circuit design system as in claim 18 wherein said crosstalk calculating means comprises:
   means for selecting a path between register pairs for crosstalk delay analysis;
   means for calculating a path delay through said selected path; and
   means for categorizing said selected path according to said tree-like structure, path crosstalk overhead delays being provided responsive to categories for said selected path.

20. A circuit design system as in claim 19 wherein said means for selecting said path comprises:
   means for selecting a clock domain;
   means for selecting a terminating register in said selected clock domain; and
   means for counting cells in each path terminating in said terminating register.

21. A circuit design system as in claim 20 wherein said means for selecting a path between register pairs for analysis comprises means for inserting an incremental crosstalk overhead to setup time for the selected terminating register.

22. A computer program product for designing integrated circuits, said computer program product comprising a computer usable medium having computer readable program code thereon, said computer readable program code comprising:
   computer program code means for developing a stochastic model of a circuit design;
   computer program code means for calculating a crosstalk overhead for each path between register pairs in the circuit design responsive to said stochastic model; and
   computer program code means for identifying paths between register pairs having a path delay exceeding a specified acceptable maximum path delay.

23. A computer program product as in claim 22 wherein said computer program code means for developing a stochastic model comprises:
   computer program code means for selecting one of a plurality of completed integrated circuit designs in a selected technology for analysis;
   computer program code means for selecting a metal wiring layer of said selected integrated circuit design;
   computer program code means for finding a net crosstalk maximum length for said selected metal wiring layer;

computer program code means for storing results of said analysis for subsequent analysis; and computer program code means for building a net crosstalk maximum length model for said selected metal wiring layer.

24. A computer program product as in claim 23 wherein the computer program code means for identifying paths comprises computer program code means for identifying a global net within said selected metal wiring layer having a distance between cells exceeding said net crosstalk maximum length.

25. A computer program product as in claim 24 wherein the computer program code means for identifying paths comprises:

computer program code means for segmenting said identified global net; and computer program code means for inserting a repeater into said identified global net between segments.

26. A computer program product as in claim 22 wherein said computer program code means for developing a stochastic model comprises:

computer program code means for selecting one of a plurality of completed integrated circuit designs;

computer program code means for analyzing said plurality of completed integrated circuit designs for crosstalk and storing the results of said analysis;

computer program code means for generating crosstalk related design statistics on each of said plurality of completed integrated circuit designs;

computer program code means for building a tree-like structure responsive to design wiring factors;

computer program code means for mapping said crosstalk related design statistics to said tree-like-structure; and computer program code means for calculating statistical values relating said tree-like structure with crosstalk delays.

27. A computer program product as in claim 26 wherein said computer program code means for calculating a crosstalk overhead comprises:

computer program code means for selecting a path within the plurality of completed integrated circuit designs for crosstalk delay analysis;

computer program code means for calculating a path delay through said selected path; and computer program code means for categorizing said selected path according to said tree-like structure, path crosstalk overhead delays being provided responsive to categories for said selected path.

28. A computer program product as in claim 27 wherein said computer program code means for selecting said path comprises:

computer program product means for selecting a clock domain;

computer program product means for selecting a terminating register in said selected clock domain; and computer program product means for counting cells in each path terminating in said terminating register.

29. A computer program product as in claim 28 wherein said computer program code means for selecting said path comprises computer program code means for inserting an incremental crosstalk overhead to setup time for the selected terminating register.

* * * * *